(12) United States Patent
Coughlin

(10) Patent No.: US 7,180,292 B2
(45) Date of Patent: Feb. 20, 2007

(54) COOLING OF COILS IN MAGNETIC RESONANCE IMAGING

(75) Inventor: Joseph Andrew Coughlin, Storrington (GB)

(73) Assignee: Tesla Engineering Ltd, Sussex (GB)

( * ) Notice: Subject to any disclaimer, the term of this patent is extended or adjusted under 35 U.S.C. 154(b) by 102 days.

(21) Appl. No.: 11/052,845

(22) Filed: Feb. 9, 2005

(65) Prior Publication Data

US 2005/0179435 A1    Aug. 18, 2005

(30) Foreign Application Priority Data

Feb. 16, 2004    (GB) ................. 0403374.2

(51) Int. Cl.
*G01V 3/00*    (2006.01)
(52) U.S. Cl. .................................... 324/318
(58) Field of Classification Search ............ 324/318
See application file for complete search history.

(56) References Cited

U.S. PATENT DOCUMENTS 4,601,493 A * 7/1986 Ross et al. ................ 285/53
6,741,152 B1 * 5/2004 Arz et al. .................. 335/300
2001/0033168 A1 * 10/2001 Heid ......................... 324/322
2001/0047760 A1 * 12/2001 Moslehi ............... 118/723.001
2003/0141870 A1 * 7/2003 Schuster et al. ............ 324/318
2005/0035764 A1 * 2/2005 Mantone et al. ............ 324/318

FOREIGN PATENT DOCUMENTS

| GB | 881908 | 11/1961 |
| GB | 1273778 | 5/1972 |
| GB | 2323207 A | 9/1998 |
| GB | 2342986 | 4/2000 |
| JP | 60-72207 | 4/1985 |

OTHER PUBLICATIONS

UK Search Report.

* cited by examiner

*Primary Examiner*—Diego Gutierrez
*Assistant Examiner*—Megann E Vaughn
(74) *Attorney, Agent, or Firm*—Nixon & Vanderhye P.C.

(57) ABSTRACT

An MRIS gradient coil structure has coiled tubes for carrying a cooling medium to cool the coil structure. The inlet and outlet of the coiled tubes are insulated electrically from the remainder thereof by a ceramic insulator.

16 Claims, 1 Drawing Sheet

COOLING OF COILS IN MAGNETIC RESONANCE IMAGING

BACKGROUND

1. Technical Field

This invention relates to magnetic coil structures such as those used as gradient coils in magnetic resonance imaging spectroscopy (MRIS) and in particular relates to the cooling of such coils.

2. Related Art

There are known MRIS systems which comprise a plurality of concentric coils which are located around a region within which a subject can be located. The coils include an outermost DC coil which is used to provide a strong constant magnetic field, an inner RF coil arrangement which is arranged concentrically within the DC coil and a gradient coil assembly which is located between the inner RF and the outer DC coil. The gradient coil assembly is arranged to generate a time varying magnetic field which causes the response frequency and phase of the nuclei of the patient to depend upon their positions within the field.

More recently alternative magnet geometries have been developed and in one such arrangement the magnet comprises two substantially distinct assemblies separated by a gap. In this type of arrangement a typical geometry of a gradient coil comprises two substantially planar discs located above and below the subject being imaged.

Gradient coil systems for MRIS comprise multiple electrical windings generally manufactured from copper or other suitable electrically conductive material. In use electrical currents, typically in the region of hundreds of amperes, flow though each winding and they have a complex time and amplitude sequence in order to generate spatially and temporally varying magnetic fields that in turn generate the spatial and other information required for MRIS. There is a requirement to switch the currents on and off in the shortest time possible and in order to achieve this large voltages in the kilovolt region are applied to overcome the inductance of the windings.

As explained above the windings operate in a high static magnetic field which can be up to several Tesla and are subject to large internal magnetomotive forces when pulsed. For mechanical stability it is common to integrate all the gradient windings into a single resin encapsulated structure typically annular or disc shaped depending upon the overall geometry of the MRIS system. Resin systems are known to lose their strength at a characteristic temperature known as the glass transition temperature which is typically in the range 70 to 100° C. and therefore the coils should not approach or exceed this temperature in normal operation.

In order to maximise the performance of a gradient coil system it is therefore desirable to extract the resistive heat that is generated by the currents flowing in the windings. One method of doing this is to liquid cool the coil system either indirectly through a dedicated cooling winding or directly through one or more coil windings which are in the form of a hollow conductor. Both of these methods have distinct advantages over air cooling where the heat that can be extracted is proportional to the surface area of the system and is generally quite low.

Gradient coil systems are designed to operate over a lifetime of many years. It is therefore desirable to use materials that do not degrade with time or temperature especially in the encapsulated parts of the system. This means that materials such as plastics and rubber are not suitable. Instead metal pipe work should be used for the cooling circuit wherever possible and all joints need to be soldered, welded or brazed. If some or all of the cooling fluid passes through one of the electrical windings, that part of the cooling circuit will, by definition, be metallic.

Arrangements of this type however have difficulties due to the viscosity of cooling liquids, and limited available space, and it is rarely possible to achieve optimal cooling with a single cooling circuit. Instead, the cooling circuit is split into multiple sections that form parallel cooling circuits. These cooling sections need to be manifolded at some point, so that the total liquid flow can be supplied from one source. Also it is desirable that the manifold and its associated pipework be encapsulated, for durability. However, if the manifolding is executed with metallic joints, it creates a number of low-resistance electrical loops. Such loops carry induced currents when the coil windings are switched on and off, and these currents in turn generate parasitic magnetic fields, which seriously degrade the functional performance of the gradient coil system.

A further difficulty arises if part of the cooling circuit is one of the electrical windings. In this case, as the winding is switched on and off, various cooling feeds and returns are at widely differing electrical potentials, and a conducting joint can constitute an electrical short-circuit of the winding.

As a consequence of these design considerations, it is necessary to use insulating joints to link the cooling circuits to the manifolds. It is normal practice for these joints to be made of rubber or plastic, and for them not to be encapsulated, so that they may be serviced and repaired.

The manifolding method referred to above is not ideal since it leaves much external pipework exposed and therefore vulnerable. If the cooling windings are also coil windings, this technique involves bringing a large number of conductors carrying high voltages out of resin encapsulation, and into atmosphere. This has safety implications, especially if it is wrongly assumed that the cooling system is at ground potential. Furthermore, regulations on conductor spacing in air mean that such manifolding takes up a large amount of space.

BRIEF SUMMARY

The present invention has been designed in order to obviate the above-mentioned difficulties.

According to the present invention there is provided a coil structure for use as a gradient coil in MRIS, said coil structure including coiled tubes for carrying a cooling medium to cool the coil structure, wherein the inlet and outlet means of the coiled tubes are insulated electrically from the remainder thereof by ceramic insulation means. The coiled tubes may be the electrical current carrying conductors of the coil structure. The insulation means may comprise one or more tubular ceramic members. The or each tubular ceramic member may be connected to the coiled tubes by a brazed joint.

The coiled tubes may form multiple coil loops each having an insulated connection to the manifold for the fluid inlet and the manifold for the fluid outlet. The cooling medium may be water.

Embodiments in accordance with the present invention have the advantage that they use, in an MRIS gradient coil, a permanent insulating joint between two or more electrical conductors that is suitable for encapsulation in the epoxy resin and is also capable of carrying a cooling medium. The insulating part of the joint comprises a hollow liquid tight ceramic component and the tubular conductors of the coil structure may be brazed to create a joint with the insulating ceramic tube.

BRIEF DESCRIPTION OF THE DRAWINGS

The invention will be described now by way of example only, with particular reference to the accompanying drawings. In the drawings.

DETAILED DESCRIPTION OF EXEMPLARY EMBODIMENTS

Figure 1:
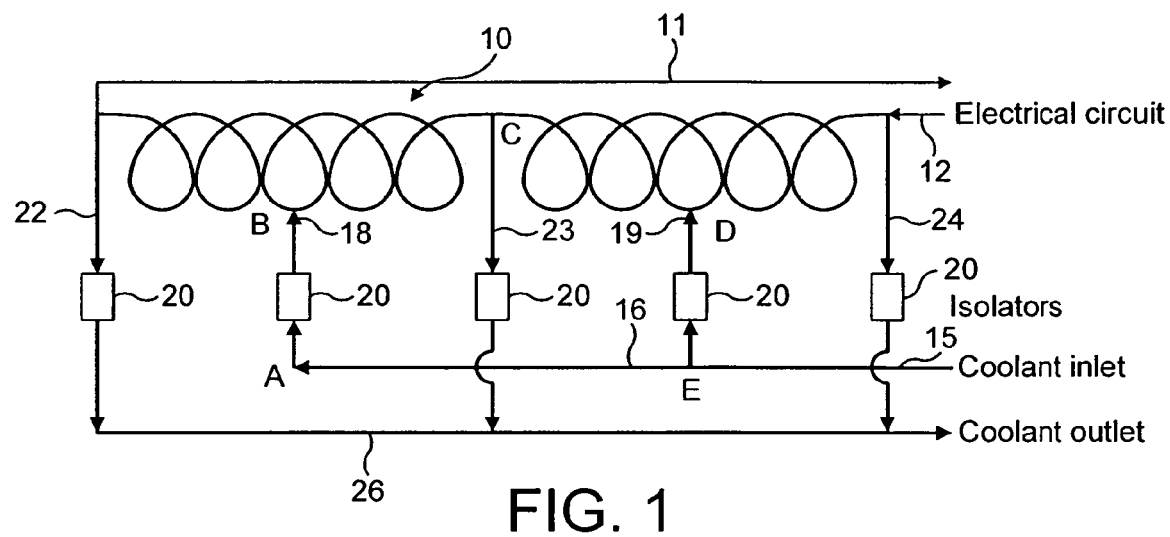
FIG. 1 is a schematic view showing a single gradient coil winding constructed in accordance with the present invention.

Referring to FIG. 1, a gradient coil is shown generally at (10) and is constructed from tubular conductive material such as copper so that those conductors can carry electrical currents to enable the coils to generate the necessary gradient fields and also can also act as conduit for cooling fluid such as water. Connections to an electrical power source are shown at (11) and (12). The cooling fluid is supplied to the coil structure via a coolant inlet (15) which feeds a manifold (16). The manifold (16) is connected to points (18) and (19) on the coil structure by way of isolators or insulators (20). In this way multiple cooling loops are created within the coil structure. Cooling fluid can leave the coil structure by way of tubes (22, 23, 24) which are connected to an outlet manifold (26) by way of further isolators (20).

Figure 2:
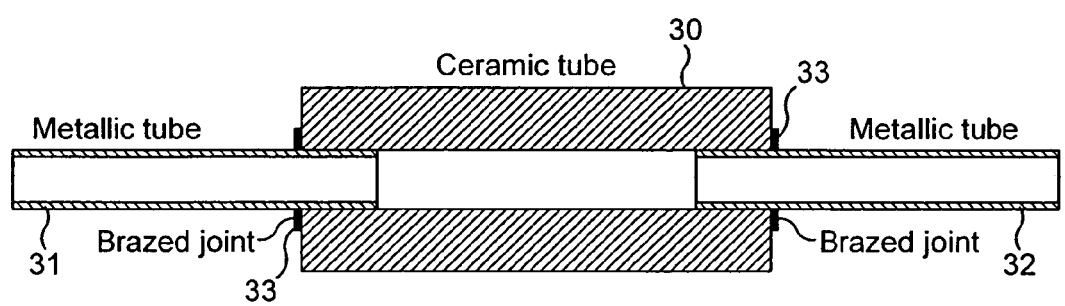
FIG. 2 is a sectional view showing an insulator or isolator used in the arrangement of FIG. 1.

Each isolator (20) is shown in more detail in FIG. 2 of the drawings. Each isolator comprises a ceramic tube (30) which is connected to the metallic tubing (31) and (32) of the coil structure by way of brazed joints (33). It will be seen therefore that the ceramic tube (30) isolates electrically the tube portion (32) from the tube portion (31), but allows cooling fluid to flow through the tubing and into the coil structure.

The brazing technique can be a known specialised high temperature process such as vacuum brazing, which can be carried out on a small sub-assembly of the tubing, which is then incorporated in the pipework of the gradient coil assembly by standard metal-to-metal jointing techniques such as soldering, silver soldering, or conventional brazing.

The majority of the structure shown schematically in FIG. 1 including the manifolding, is encapsulated in an epoxy resin with essentially only the input and output connections exposed for connection to liquid cooling.

As shown in the described embodiment each manifold is principally a metallic structure with two or more ceramic insulators. It is possible to conceive of an embodiment in which the manifold itself is a ceramic component connected to multiple metallic inlet and outlet tubes.

The exemplary embodiment described above may provide advantages such as the following.
1) Some or all manifolding can be encapsulated in resin together with the gradient coil system, thereby leaving only a few input and output connections for liquid cooling.
2) The input and output connections may be maintained at ground potential, for operator safety and compactness.
3) The coolant circuit can be completed and tested at an earlier stage than in conventional arrangements.
4) A closed mould with fewer sealing points may be used for resin impregnation. This enables the mould to be oriented at the optimal angle for resin penetration of the assembly.
5) There are no hoses to replace or fit after resin impregnation, and therefore finishing work can be significantly reduced.
6) The space that has been used in conventional arrangement for manifolding in air can be vacuum-impregnated, which leads to a more robust assembly.

What is claimed is:

1. A coil structure for use as a gradient coil in MRIS, said coil structure comprising:
    coiled tubes for carrying a fluid cooling medium to cool the gradient coil structure, and
    coolant inlet and outlet structure of the coiled tubes being insulated electrically from the remainder thereof by ceramic insulation.

2. A coil structure as in claim 1, wherein the coiled tubes are electrical current carrying conductors of the coil structure.

3. A coil structure as in claim 1, wherein the insulation comprises at least one tubular ceramic members.

4. A coil structure as in claim 3, wherein each tubular ceramic member is connected to the coiled tubes by at least one brazed joint.

5. An MRIS gradient coil structure comprising a coil structure according to claim 1, which is encapsulated in an encapsulating material.

6. An MRIS gradient coil structure as in claim 5, wherein the encapsulating material is an epoxy resin.

7. A coil structure as in claim 1, wherein the coiled tubes form multiple cooling circuits, each cooling circuit having an electrically insulated connection to a manifold for a fluid inlet and a manifold for a fluid outlet.

8. A coil structure as in claim 1, wherein the cooling medium is water.

9. A coil structure for use as a gradient coil in MRIS, said structure comprising:
    coiled tubes for carrying a liquid cooling medium to cool the gradient coil structure,
    said coiled tubes being the electrical current carrying conductors of the coil structure, and
    inlet and outlet structure for the cooling medium passing to and from the coiled tubes being insulated electrically from the remainder thereof by an electrical insulator.

10. A coil structure as in claim 9, wherein:
    the coiled tubes form multiple cooling circuits, each cooling circuit having an electrically insulating connection to a manifold for a cooling medium inlet and a cooling medium outlet.

11. A coil structure as in claim 10, wherein:
    at least the electrical current carrying conductors, the insulator and part of the manifold are encapsulated in encapsulating material.

12. A coil structure as in claim 11, wherein the insulator is epoxy resin.

13. A coil structure as in claim 9, wherein the insulation is a ceramic insulator.

14. A coil structure for use as a gradient coil in MRIS, said coil structure comprising:
    coiled tubes carrying a cooling medium to cool the gradient coil structure,
    the coiled tubes having a manifold section with an input and an output for the cooling medium, said manifold being connected to the remainder of the coiled tubes by electrically insulating conduits so that the manifold is electrically insulted from the remainder of the coiled tubes, the structure being such that the cooling medium can flow from the input through the coiled tubes to the output in order to cool current carrying conductors of the gradient coil.

15. An MRI gradient coil assembly comprising:

electrically conductive gradient coil windings in thermal contact with an electrically conductive liquid coolant flow path including inlet and outlet flow manifolds to a main fluid inlet and a main fluid outlet;

said flow manifolds including portions that are made of an electrically insulating material so as to electrically insulate said main fluid inlet and main fluid outlet from other portions of the flow path which provides cooling to the gradient coil windings; and an encapsulating material encapsulating both said gradient coil windings and said liquid coolant flow path including said manifold together as a unitary gradient coil structure except for liquid connection accesses to said main fluid inlet and said main fluid outlet.

16. An MRI gradient coil assembly as in claim 15 wherein said liquid flow path in thermal contact with said gradient coil windings comprises a hollow passageway within said gradient coil windings.

* * * * *